(12) United States Patent
Vogtmeier

(10) Patent No.: US 7,112,799 B2
(45) Date of Patent: Sep. 26, 2006

(54) X-RAY DETECTOR WITH A PLURALITY OF DETECTOR UNITS

(75) Inventor: Gereon Vogtmeier, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/528,396

(22) PCT Filed: Aug. 4, 2003

(86) PCT No.: PCT/IB03/03421

§ 371 (c)(1),
(2), (4) Date: Mar. 17, 2005

(87) PCT Pub. No.: WO2004/027454

PCT Pub. Date: Apr. 1, 2004

(65) Prior Publication Data
US 2005/0236573 A1    Oct. 27, 2005

(30) Foreign Application Priority Data
Sep. 18, 2002    (EP) ............................. 020788618

(51) Int. Cl.
*G01T 1/24*    (2006.01)
*H01L 27/00*    (2006.01)

(52) U.S. Cl. .............................. 250/370.09; 378/98.8; 250/370.11

(58) Field of Classification Search ........... 250/370.09, 250/370.11; 378/98.8, 19
See application file for complete search history.

(56) References Cited

U.S. PATENT DOCUMENTS

| 4,213,137 A | * | 7/1980 | Pines ......................... 257/229 |
| 4,571,495 A | | 2/1986 | Distler et al. |
| 4,621,194 A | | 11/1986 | Yoshida et al. |
| 5,041,729 A | * | 8/1991 | Takahashi et al. ...... 250/370.11 |
| 5,355,013 A | * | 10/1994 | Parker ....................... 257/458 |
| 5,430,298 A | | 7/1995 | Possin et al. |
| 5,742,060 A | * | 4/1998 | Ashburn ................ 250/370.09 |
| 6,393,092 B1 | | 5/2002 | Yoshida |
| 6,600,160 B1 | * | 7/2003 | Kobayashi et al. .... 250/370.09 |
| 2001/0016029 A1 | | 8/2001 | Turner |
| 2001/0020683 A1 | | 9/2001 | Teranuma et al. |
| 2002/0130266 A1 | * | 9/2002 | Kyyhkynen ........... 250/370.09 |
| 2003/0020019 A1 | * | 1/2003 | Wischmann et al. ... 250/370.09 |

FOREIGN PATENT DOCUMENTS

WO    WO 00/25149    5/2000

\* cited by examiner

*Primary Examiner*—David Porta
*Assistant Examiner*—Mark R. Gaworecki

(57) ABSTRACT

An x-ray detector comprises a plurality of detector units arranged in a detection surface. Individual detector units including a sensor element and read-out circuit. The sensor elements and the read-out circuitry are spatially separated transversely to the detection surface. X-ray shielding member is at least for a part arranged between individual sensor elements and individual read-out circuits, so as to shield the read-out circuits from x-radiation.

5 Claims, 2 Drawing Sheets

X-RAY DETECTOR WITH A PLURALITY OF DETECTOR UNITS

Figure 1:
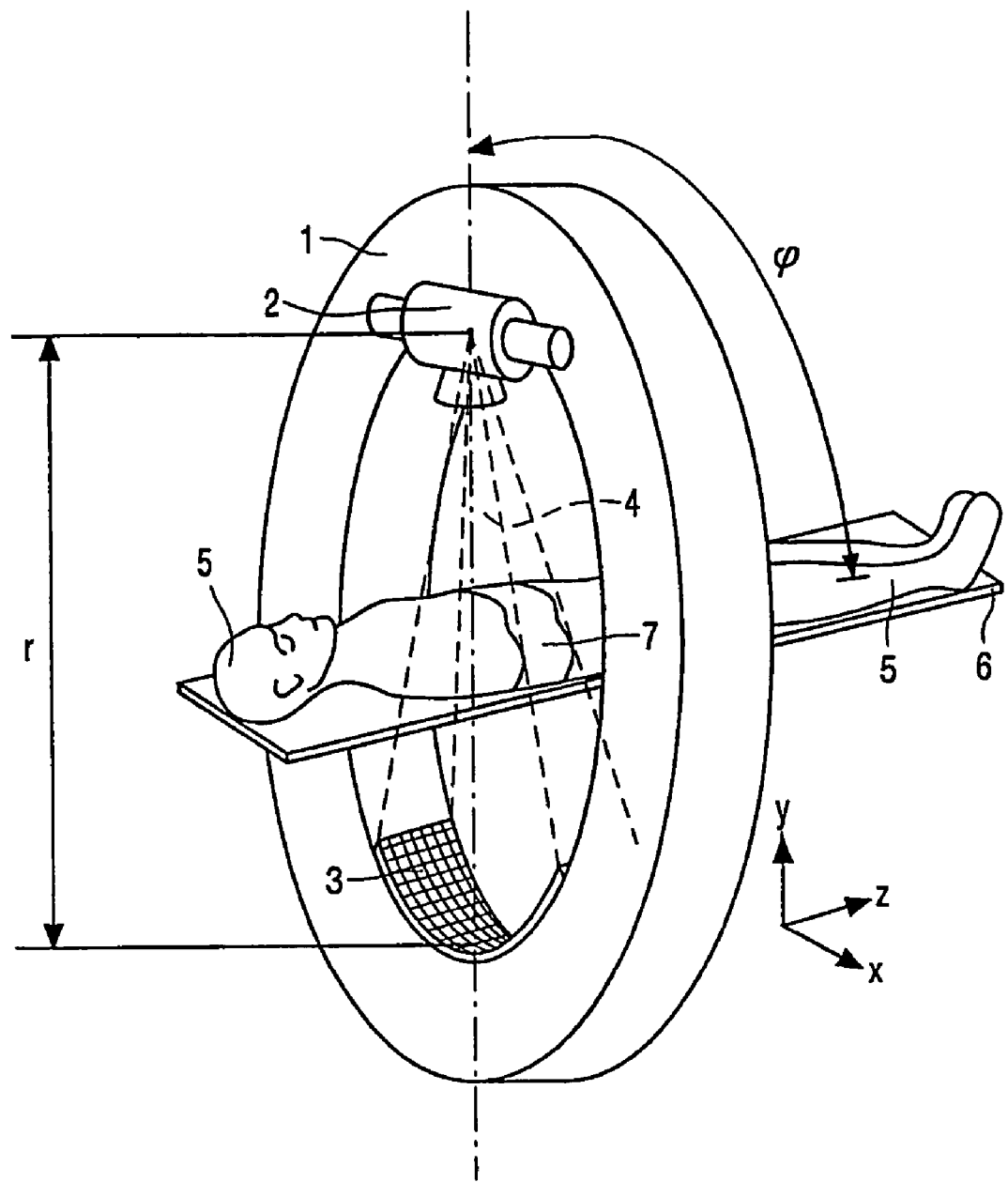

The invention pertains to a radiation detector, in particular an x-ray detector comprising a plurality of detector units arranged in a detection surface, individual detector units including a sensor element and read-out circuit.

Such a radiation detector is known from the international application WO 00/25149.

The known radiation detector is an x-ray computed tomography detector. The known radiation detector includes a scintillator which is constructed as a matrix of scintillator elements. The individual detector units of the known radiation detector include a scintillator element and a photosensor, which acts as the sensor element. The scintillator converts incident radiation into radiation of a lower energy level for which the photosensor is sensitive. In particular, monocrystalline or polycrystalline cadmium tungstate or gadolinium oxy-sulfate is used for the scintillator elements. The sensor element in the known radiation detector is a detector chip that is preferably manufactured using CMOS technology. The detector units are arranged in a matrix having rows of detector units in the surface that forms the detection surface. X-ray absorbing members are arranged as absorber layers that extend vertically relative to the surface of the scintillator. The individual detector units have their individual amplifiers elements placed directly underneath the absorber layers so as to shield the individual amplifiers from the incident radiation. Individual detector unit have their respective read out circuitry in which the amplifier of the relevant detector unit forms part.

Because the amplifier elements must be very accurately aligned with the absorber layers, the amplifier elements must be very precisely positioned and this involves a cumbersome step in the manufacturing process of the known radiation detector.

An object of the invention is to provide a x-ray detector in which electronic circuitry which is sensitive for radiation is shielded and which can be manufactured in a more simple manner. This object is achieved in the x-ray detector according to the invention wherein the sensor elements and the read-out circuitry are spatially separated transversely to the detection surface and an x-ray shielding member is at least for a part arranged between individual sensor elements and individual read-out circuits.

According to the invention, a separation transverse to the detection surface is provided between the sensor elements and the read-out circuits and an x-ray shielding member is provided in the separation. Hence, at least a radiation sensitive portions of the read-out circuit is shielded from x-radiation. Notably, these radiation sensitive portions involve amplifier, sample&hold, capacitors, switches (transistor), or parts of digital logic. In particular an amplifier in the read-out circuit is protected from x-radiation which is able to damage the amplifier. Notably, the x-ray shielding member is formed as blade of x-ray absorbing material. Materials having a relative high atomic number (Z) are usually suitable x-ray absorbing materials; the absorptivity is dependent of the energy of the x-radiation. Suitable x-ray absorbing materials are Lead, or Tungsten for shielding and Molybdenum to intercept scattered x-rays Further aspects of the invention will be elaborated with reference to the embodiments as defined in the dependent Claims.

In a preferred embodiment of the x-ray detector of the invention, the sensor element and the read-out circuit of individual detector units are formed as a monoblock integrated circuit which is shaped such as to provide the separation between the sensor element and the read-out circuit which accommodates the x-ray shielding member.

In another preferred embodiment of the x-ray detector of the invention an interruption is left open in the x-ray shielding member which allows a signal connection to pass between the sensor element and the read-out circuit of the detector unit at issue. The signal connection may be formed as part of the monoblock integrated circuit of the detector unit. As an alternative, the detector unit comprises separate sensor elements and read-out circuit. Then the signal connection is made by a wire connection through the interruption. For example, interruptions are left open in the x-ray absorbing sheet or layer through which the signal connections are fed through between sensor elements and read-out circuits for respective detector units.

In a further preferred embodiment of the x-ray detector of the invention, several detection units share a common x-ray shielding member. For example this common x-ray shielding member is formed as an x-ray absorbing sheet or layer accommodated in the separation between the sensor elements and the read-out circuits. One common x-ray shielding may be provided for essentially all detector units. Alternatively, a small number of common x-ray shielding members may be employed, where respective common x-ray shielding members are provided for groups of detector units. The use of one or a few common x-ray shielding members makes it more easy to build up the x-ray detector of the invention. For a CT-detector having several rows of detector units preferably respective x-ray shielding members are provided for individual rows of detector units. For a detector matrix having a plurality of rows and columns of detector units, respective shielding members are provided for example for individual quadrants of the detector matrix. The detector matrix is particularly suitable for acquiring an x-ray shadow image.

Preferably large detectors are built up of many modules with a common shielding for the electronic. At the same time it is possible to have interconnections in the transverse direction, i.e. transversely to the detection surface, to provide the detector and electronic circuits with all needed signals.

Advantageously, transverse absorption units are provided which extend transversely to the detection plane. These transverse absorption units are placed between adjacent detector units. Hence, the read-circuits are shielded from scattered x-rays and secondary x-rays which propagate at an angle to the normal on the detection surface. Further the read-circuits remain shielded from x-radiation when the x-ray beam is incident at an angle substantially different from 90° on the detection surface. Also when a cone beam is employed having a wide opening angle, adequate shielding of the read-circuits of the detector unit is achieved. Notably, adequate shielding of the read-circuits is achieved for cone beams having a fan angle of about 50° to 60° and a cone angle of 1° to 6°

Preferably, the transverse absorption units are integrated in the x-ray shielding member. Notably, this is achieved by arranging the transverse absorption units as protrusions which extend transversely to the detection surface from the x-ray shielding member between read-out circuits of adjacent detector units. Preferably, the common shielding member is provided with the transverse absorption members in the form of transverse protrusions. In this way the x-ray shielding member with the transverse absorption member is manufactured as a single integrated component for a large number of detection units, or even for all detection units. Hence, the x-ray detector of the invention does not require an excessive number of additional components to provide the shielding member and the transverse absorption units.

The x-ray detector of the invention is particularly suitable to be employed in an x-ray examination apparatus in which the x-ray detector receives an x-ray projection image from which it derives an image signal, such as an electronic videosignal. The x-ray detector of the invention is also particularly suitable to be employed in a computed-tomography system in which the x-ray detector forms attenuation profiles from incident x-radiation which has passed through the object to be examined from several orientations. From these attenuation profiles an image data set is reconstructed representing local densities in the object. The image data set may relate to one or several cross sections through the object, but the image data set may also pertain to a reconstructed volume of the object to be examined. In particular the x-ray detector when employed in a computed tomography system is preferably arranged as a two-dimensional detector which can acquire attenuation profiles from several slices in the object simultaneously or which can acquire attenuation profiles from a cone shaped x-ray beam.

Figure 2:
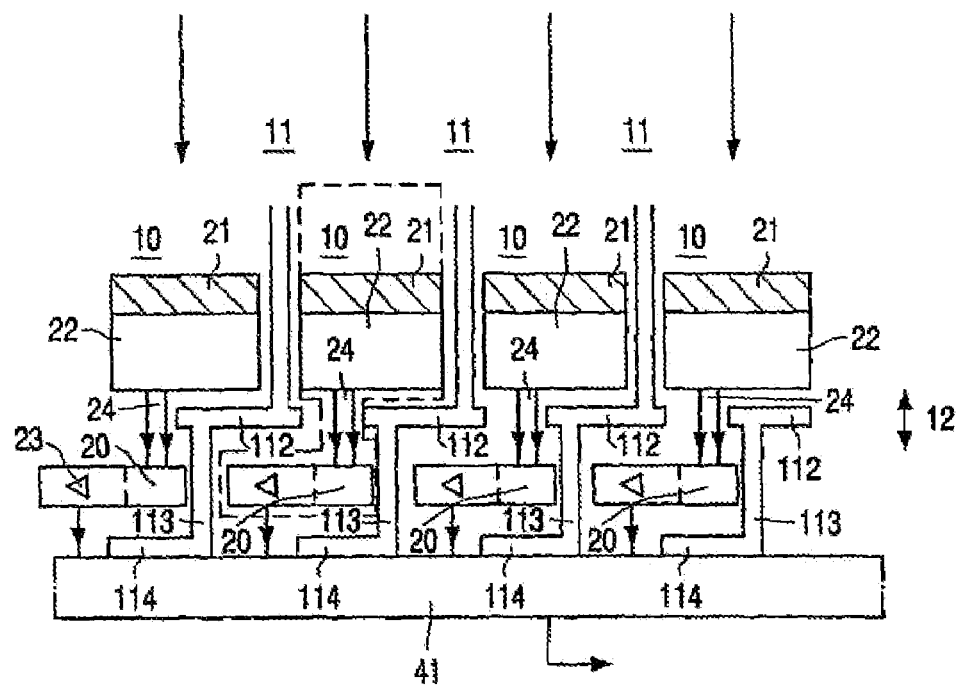
Figure 3:
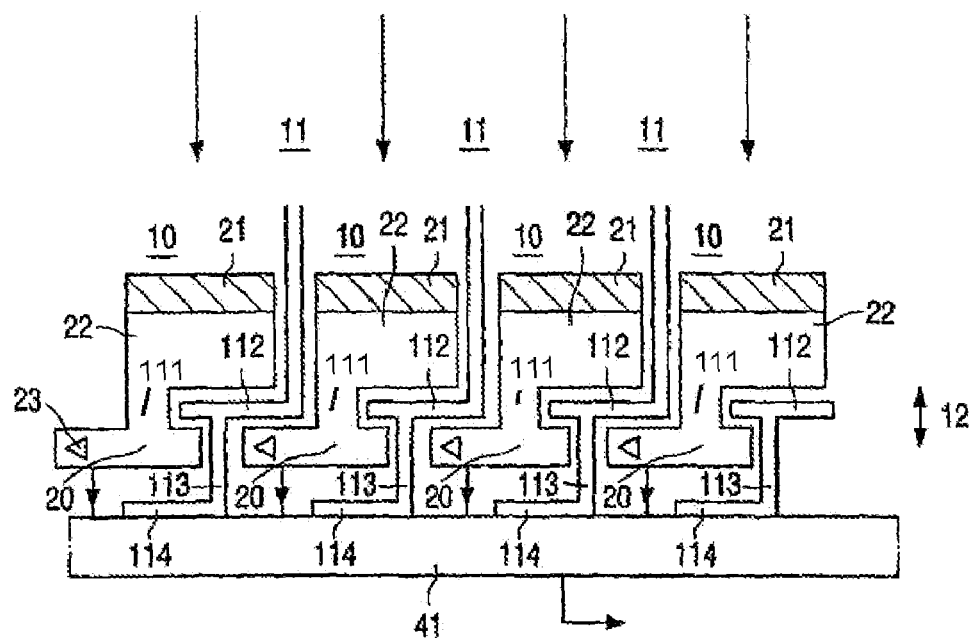

FIG. 1 shows diagrammatically a computed-tomography system in which a radiation detector of the invention is used in the form of a multi-line detector 3 which is formed as a detector array, FIG. 2 shows a schematic representation of a first embodiment of the radiation detector according to the invention and FIG. 3 shows a schematic representation of a second embodiment of the radiation detector according to the invention.

FIG. 1 shows diagrammatically a computed-tomography system with a multi-line detector 3 which is formed as a detector array. The X-ray source 2 as well as the facing multi-line detector 3 are mounted in a circular portal frame or gantry 1. The X-ray source 2 emits a cone-shaped X-ray beam 4 through the patient 5 and onto the multi-line detector 3. The patient 5 to be examined is transported through the rotating gantry 1 on a table 6.

The detector array 3 is arranged at a distance r from the focus of the X-ray source 2. During a complete revolution of the gantry 1, the X-ray beam 4 irradiates the patient 5 in the gantry plane from different directions φ relative to the normal to form respective attenuation profiles which are received by the multi-line detector. A cross-sectional image 7 of the patient in the irradiated zone is reconstructed on the basis of these attenuation profiles.

The detector array 3 is composed of a plurality of detector units 10 which are arranged in a plurality of rows. These rows extend in parallel in the direction of the axis of rotation (z direction). The shape of the cone beam is described by its fan angle and its cone angle. The fan angle is the angle at the x-ray focus subtended between extreme x-rays in the plane of the gantry. A typical value for the fan angle is about 58°. The cone angle is the angle at the x-ray focus subtended between extreme x-rays in the plane perpendicular to the plane of the gantry and parallel to the z-axis. For a detector array having 20 rows of detector units, a typical value for the cone angle is 2°.

FIG. 2 shows a schematic representation of a first embodiment of the radiation detector according to the invention. In particular FIG. 2 concerns an x-ray detector with a plurality of detector elements 10 of which by way of example only four are shown. The direction from which the x-rays are incident is shown by the vertical arrows. Individual detector elements 10 include a scintillator element 21 and a photosensor 22, for example a photodiode. Incident x-rays are converted by the scintillator element 21 into radiation of a lower energy, preferably having a wavelength in the range between 300 nm to 500 nm. e.g. green light for which the photosensor element 22 is sensitive. Suitable material for the scintillator elements are monocrystalline or polycrystalline cadmium tungstate or gadolinium oxy-sufide. Notably, cadmium-tungstate has a good conversion yield of x-radiation into radiation of a lower energy having a wavelength of about 480 nm. The photosensor elements form electric charges in response to the green light. To read-out the electric charges, individual detector elements are provided with read-out circuits 20. These read-out circuits comprise a portion 23 that is particularly radiation sensitive. For example the radiation sensitive portions 23 of the detector units include amplifiers. The electric charges read-out by the read-out circuits are provided in the form of electric signals to a signal channel 41 which carries the signal to an image signal output (not shown). The read-out circuits are preferably employed in the form of CMOS chips.

Between individual, notably adjacent detector units, x-ray shielding members 11 are provided. Individual x-ray shielding members 11 comprise several segments. Main segments 111 are placed between adjacent photosensors and extend mainly along the propagation direction of the primary incident x-rays. These main segments 111 intercept scattered x-rays. Notably, x-ray scattering occurs by Compton scattering in the patient to be examined. These scattered x-rays do not carry useful image information, but would cause a so-called veiling glare in the x-ray image. The sensor elements and the read-out circuits of the detector elements are separated 12 laterally so that a lateral segment 112 of the x-ray shielding members is accommodated in the lateral separation 12. The x-ray shielding member, more particularly the lateral segments 112 are placed over the radiation sensitive portions 23 of the read-out circuits 20 of the respective detector units 10. Hence, the lateral segments 112 of the x-ray shielding members 112 intercept or absorb x-rays and so avoid that these x-rays can reach the radiation sensitive portions 23. Accordingly, radiation damage to the read-out circuits 20, notably to the radiation sensitive portions 23 which include for example the amplifiers is avoided.

The electric charges in the photosensors 22 are conveyed to the readout circuits 20 via feed-through through the interruptions 24 that are left open between adjacent lateral segments 112 of the x-ray shielding members 11. For example a simple wire connection can be used to convey the electric charges from the photosensors to the read-out circuits. The read-out circuits are designed in such a way that portions that are insensitive to radiation, notably x-rays are placed directly underneath the interruptions 24. Especially, the radiation sensitive amplifiers are placed remote from the interruptions and well below the lateral segments 112 of the x-ray shielding members 11.

Further, the individual x-ray shielding members are provided with transverse absorption members 113 which separate adjacent read-out circuits. These transverse absorption members 113 absorb x-rays, notably secondary x-rays and scattered x-rays. Hence, the read-out circuits 20 and especially their radiation sensitive portions 23 are protected from these secondary and scattered x-rays that propagate at an angle with respect to the direction of incidence of the primary x-rays.

Additionally, the individual x-ray shielding members are provided with an extra lateral shielding member 114 that serves as a base plate by which the x-ray shielding members are mounted on the signal channel 41. Further, the extra lateral shielding members 114 provide additional protection for the signal channel 41, or any electronics on the backplane substrate of the detector or on flex-cables which connect parts of the signal channel. Hence, the signal channel may be implemented in polycrystalline charge-transfer devices.

The individual x-ray shielding members can be manufactured as integrated units comprising the respective segments. Suitable manufacturing technologies to construct the x-ray shielding members involve for example gluing, bending and welding.

The x-ray shielding member also absorbs the radiation of lower energy, e.g. green light, that is generated in the scintillator elements 21. Hence, it is avoided that green light from one detector element can reach the photosensor of a neighbouring detector element.

FIG. 3 shows a schematic representation of a second embodiment of the radiation detector according to the invention. The embodiment shown in FIG. 3 is quite similar to the embodiment shown in FIG. 2. The main distinction concerns that for the respective detector units, the photosensor, the read-out circuit and the feed-through are integrated in a semiconductor monoblock.

The invention claimed is:

1. An x-ray detector comprising:
   a plurality of detector units operatively associated with a detection surface;
   individual detector units including a sensor element and read-out circuit such that the sensor elements and the read-out circuitry are spatially separated transversely to the detection surface; and
   an x-ray shielding member at least partially between individual sensor elements and individual read-out circuits,
   wherein in the x-ray shielding member an interruption is left open, and
   a signal connection from the sensor element to the read-out circuit passes through the interruption.

2. An x-ray detector as claimed in claim 1, wherein the x-ray shielding member extends over several detection units.

3. An x-ray detector comprising:
   a number of detector units operatively associated with a detection surface;
   individual detector units having a sensor element and read-out circuit so that the sensor elements and the read-out circuitry are spatially separated transversely to the detection surface; and
   an x-ray shielding member with at least a portion between individual sensor elements and individual read-out circuits,
   wherein adjacent read-out circuits are separated by transverse absorption units.

4. An x-ray detector comprising:
   one or more detector units arranged in a detection surface;
   each detector unit having a sensor element and read-out circuit such that each sensor element and each read-out circuitry spatially separated transversely to the detection surface; and
   an x-ray shielding member with at least a portion between individual sensor elements and individual read-out circuits,
   wherein adjacent read-out circuits are separated by transverse absorption units and the transverse absorption units are integrated in the x-ray shielding member.

5. An x-ray detector as claimed in claim 4, wherein within individual detector units, the sensor element and the read-out circuit are offset parallel to the detection surface.

* * * * *